US012796546B2

(12) United States Patent
Kim et al.

(10) Patent No.: US 12,796,546 B2
(45) Date of Patent: Nov. 10, 2026

(54) SEMICONDUCTOR PACKAGE

(71) Applicant: Samsung Electronics Co., Ltd., Suwon-si (KR)

(72) Inventors: Jae Choon Kim, Suwon-si (KR); Hwanjoo Park, Suwon-si (KR); Sunggu Kang, Suwon-si (KR); Sung-Ho Mun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 667 days.

(21) Appl. No.: 18/188,627

(22) Filed: Mar. 23, 2023

(65) Prior Publication Data

US 2024/0072020 A1 Feb. 29, 2024

(30) Foreign Application Priority Data

Aug. 30, 2022 (KR) ........................ 10-2022-0109370

(51) Int. Cl.

| | |
|---|---|
| ***H01L 25/10*** | (2006.01) |
| ***H10B 80/00*** | (2023.01) |
| ***H10W 70/60*** | (2026.01) |
| ***H10W 70/65*** | (2026.01) |
| ***H10W 70/685*** | (2026.01) |
| ***H10W 74/10*** | (2026.01) |
| ***H10W 80/00*** | (2026.01) |
| ***H10W 90/00*** | (2026.01) |
| *H10W 72/90* | (2026.01) |

(52) U.S. Cl.

CPC ............ *H10W 90/00* (2026.01); *H10B 80/00* (2023.02); *H10W 70/611* (2026.01); *H10W 70/65* (2026.01); *H10W 70/685* (2026.01); *H10W 74/121* (2026.01); *H10W 74/131* (2026.01); *H10W 80/743* (2026.01); *H10W 72/9415* (2026.01); *H10W 90/722* (2026.01); *H10W 90/724* (2026.01); *H10W 90/751* (2026.01)

(58) Field of Classification Search

None

See application file for complete search history.

(56) References Cited

U.S. PATENT DOCUMENTS

| | | | | |
|---|---|---|---|---|
| 6,873,040 | B2 * | 3/2005 | Howard .................. | H01L 23/13 257/691 |
| 6,906,415 | B2 * | 6/2005 | Jiang ....................... | H01L 23/13 257/676 |
| 7,098,542 | B1 * | 8/2006 | Hoang ................ | H01L 25/0652 257/E25.011 |
| 8,633,597 | B2 | 1/2014 | Sweeney et al. | |

(Continued)

FOREIGN PATENT DOCUMENTS

| | | |
|---|---|---|
| KR | 10-2022-0019186 A | 2/2022 |
| KR | 10-2022-0116922 A | 8/2022 |

*Primary Examiner* — Long Pham

(74) *Attorney, Agent, or Firm* — Wolf, Greenfield & Sacks, P.C.

(57) ABSTRACT

A semiconductor package may include a lower structure, a first semiconductor chip on the lower structure, the first semiconductor chip including a hot spot, a second semiconductor chip horizontally spaced apart from the first semiconductor chip on the lower structure, and a connection chip in the lower structure and connecting the first and second semiconductor chips to each other. The hot spot may vertically overlap the connection chip.

20 Claims, 16 Drawing Sheets

(56) References Cited

U.S. PATENT DOCUMENTS

| | | | |
|---|---|---|---|
| 9,875,969 B2 | 1/2018 | Braunisch et al. | |
| 10,170,456 B2 | 1/2019 | Sung et al. | |
| 10,832,942 B2 * | 11/2020 | Leobandung | H01L 25/0655 |
| 10,916,507 B2 | 2/2021 | Arvin et al. | |
| 10,943,869 B2 * | 3/2021 | Zhai | H01L 24/19 |
| 11,101,191 B2 | 8/2021 | Sikka et al. | |
| 11,222,847 B2 | 1/2022 | Mahajan et al. | |
| 11,309,895 B2 | 4/2022 | Dabral et al. | |
| 2018/0358298 A1 * | 12/2018 | Zhai | H01L 24/19 |
| 2020/0035603 A1 * | 1/2020 | Rubin | H10W 70/65 |
| 2020/0098692 A1 | 3/2020 | Liff | |
| 2021/0407909 A1 | 12/2021 | Jadhav et al. | |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0109370, filed on Aug. 30, 2022, in the Korean Intellectual Property Office, the entire contents of which are hereby incorporated by reference.

BACKGROUND

The present disclosure relates to a semiconductor package, and in particular, to a semiconductor package including a plurality of semiconductor chips.

A semiconductor package is configured to use an integrated-circuit chip as a part of an electronic product. In general, the semiconductor package includes a printed circuit board (PCB) and a semiconductor chip, which is mounted on the PCB and is electrically connected to the PCB by bonding wires or bumps. With the recent development of the electronics industry, a semiconductor package technology is developing in various ways with the goal of miniaturization, weight reduction, and manufacturing cost reduction. In addition, as the use of this technology is expanding to various fields such as mass storage devices, various types of semiconductor packages are emerging.

SUMMARY

An embodiment of the inventive concept provides a semiconductor chip with an improved heat dissipation property and a highly-reliable semiconductor package including the semiconductor chip.

According to an embodiment of the inventive concept, a semiconductor package may include a lower structure, a first semiconductor chip on the lower structure, the first semiconductor chip including a hot spot, a second semiconductor chip horizontally spaced apart from the first semiconductor chip on the lower structure, and a connection chip in the lower structure and connecting the first and second semiconductor chips to each other. The hot spot may vertically overlap the connection chip.

According to an embodiment of the inventive concept, a semiconductor package may include a lower structure, a first semiconductor chip on the lower structure, the first semiconductor chip including a hot spot, a second semiconductor chip horizontally spaced apart from the first semiconductor chip on the lower structure, a connection chip in the lower structure and connecting the first semiconductor chip to the second semiconductor chip, an adhesive layer between the connection chip and the lower structure, and a molding portion on the lower structure and the first and second semiconductor chips. The hot spot may be an intellectual property (IP) block including at least one of a central processing unit (CPU), a graphics processing unit (GPU), or a neural network processing unit (NPU). The connection chip may be vertically aligned with the hot spot. A top surface of the connection chip may be exposed to an outside of the lower structure at a top surface of the lower structure, and a top surface of at least one of the first and second semiconductor chips may be exposed to an outside of the molding portion at a top surface of the molding portion. The connection chip may have a first thickness, and at least one of the first and second semiconductor chips may have a second thickness larger than the first thickness.

According to an embodiment of the inventive concept, a semiconductor package may include a lower structure including a recessed portion, a first semiconductor chip and a second semiconductor chip on the lower structure, a connection chip in the recessed portion of the lower structure and connecting the first and second semiconductor chips, a sub-package horizontally spaced apart from the first and second semiconductor chips on the lower structure, and a molding portion on the lower structure, the first and second semiconductor chips, and the sub-package. The first semiconductor chip may include a hot spot therein, and the hot spot and at least a portion of the second semiconductor chip may overlap the connection chip in a vertical direction.

DETAILED DESCRIPTION

Example embodiments of the inventive concept will now be described more fully with reference to the accompanying drawings, in which example embodiments are shown.

Figure 1:
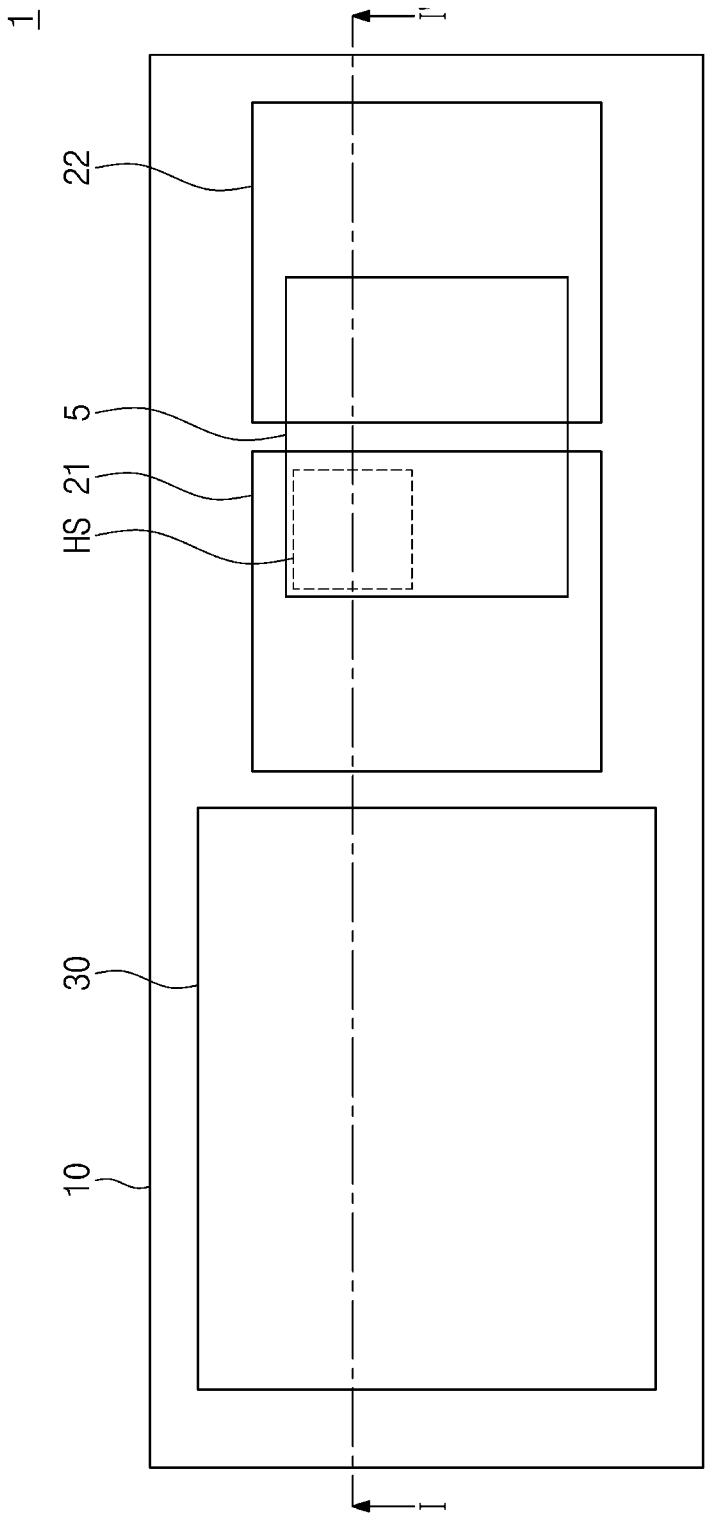
FIG. 1 is a plan view illustrating a semiconductor package according to an embodiment of the inventive concept.
Figure 2:
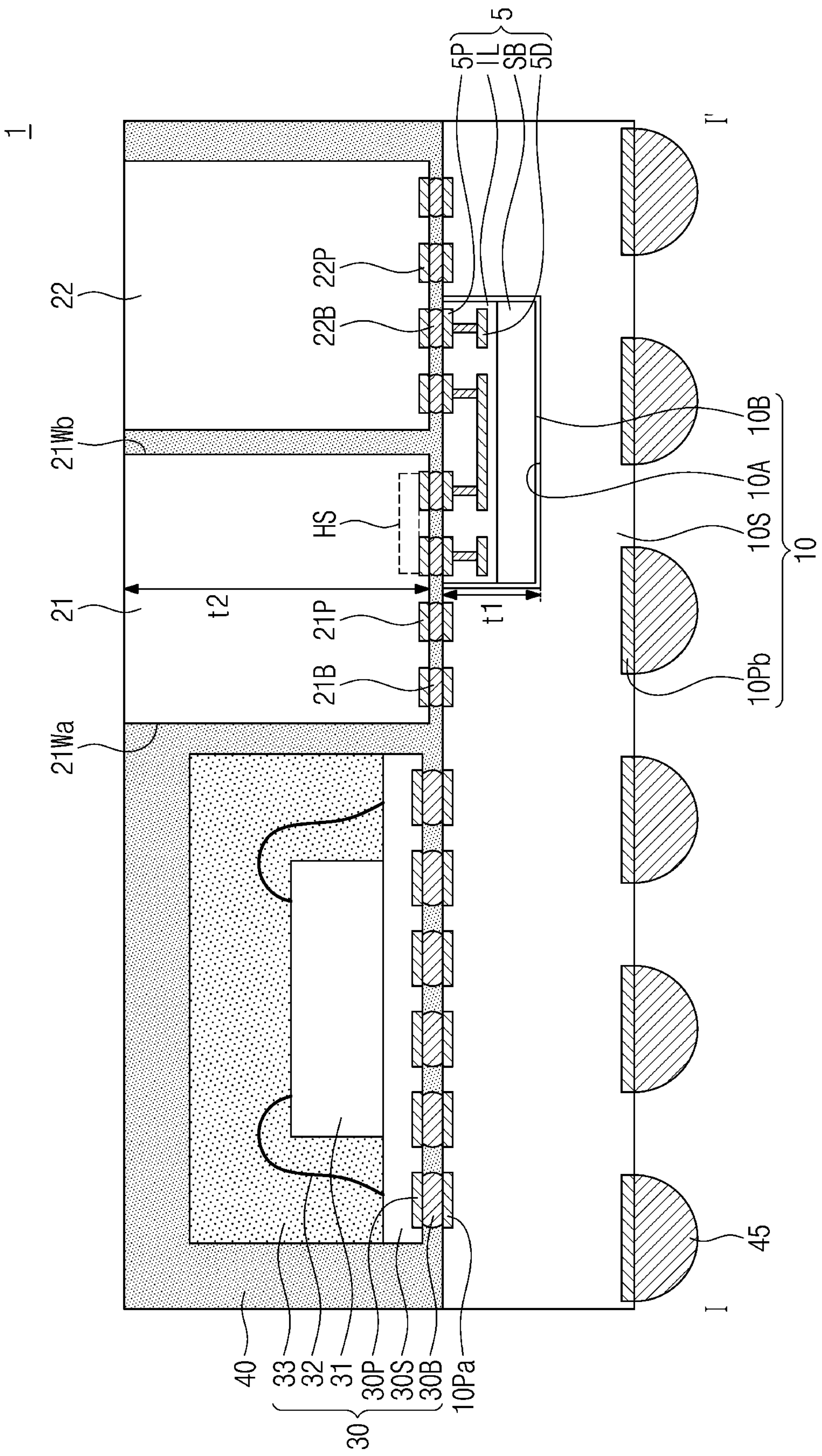
FIG. 2 is a sectional view taken along a line I-I' of FIG. 1.

FIG. 1 is a plan view illustrating a semiconductor package according to an embodiment of the inventive concept, and FIG. 2 is a sectional view taken along a line I-I' of FIG. 1.

Referring to FIGS. 1 and 2, a semiconductor package 1 may include a lower structure 10, in which a connection chip 5 is inserted, a first semiconductor chip 21, a second semiconductor chip 22, a sub-semiconductor package 30, and a molding portion or molding layer 40.

The semiconductor package 1 may have a system-in-package (SIP) structure.

The lower structure 10 may include at least one of metallic materials. The lower structure 10 may include at least one metallic material selected from the group consisting of silver (Ag), copper (Cu), gold (Au), chromium (Cr), aluminum (Al), tungsten (W), zinc (Zn), nickel (Ni), iron (Fe), platinum (Pt), and lead (Pb).

The lower structure 10 may include an insulating layer 10S, upper substrate pads 10Pa, and lower substrate pads 10Pb.

The insulating layer 10S may include a recess or recessed portion 10A, which is formed in a top surface thereof. The upper substrate pads 10Pa may be disposed on a top surface of the insulating layer 10S, and the lower substrate pads 10Pb may be disposed on a bottom surface of the insulating layer 10S.

The first semiconductor chip 21, the second semiconductor chip 22, and the sub-semiconductor package 30 may be mounted on the lower structure 10.

The first semiconductor chip 21 may include a logic chip, a buffer chip, or a system-on-chip (SOC). For example, the first semiconductor chip 21 may be an application specific integrated circuit (ASIC) chip or an application processor (AP) chip. The ASIC chip may include an application specific integrated circuit (ASIC). The first semiconductor chip 21 may include a central processing unit (CPU) or a graphics processing unit (GPU).

The first semiconductor chip 21 may include a hot spot HS. The first semiconductor chip 21 may include a plurality of heat sources, and here, the hot spot HS may be defined as a heat source, which is one of the heat sources and generates the largest amount of heat.

The hot spot HS may be an IP block. The IP block may be a function block, which is configured to execute a specific function, and it may be one of, for example, a central processing unit (CPU), a graphics processing unit (GPU), a neural network processor (NPU), a communication processor (CP), each core in a multi-core processor, a power management unit (PMU), a clock management unit (CMU), a system BUS, a memory, a universal serial bus (USB), a peripheral component interconnect (PCI), a digital signal processor (DSP), a wired interface, a wireless interface, a controller, an embedded software, a codec, a video module (e.g., a camera interface, a video processor, a mixer, and so forth), a 3-dimensional graphics core, an audio system, or a driver.

More specifically, the hot spot HS may be in a lower portion of the first semiconductor chip 21. The hot spot HS may be provided in the first semiconductor chip 21 to be in contact with a bottom surface of the first semiconductor chip 21 or may be exposed to the outside of the first semiconductor chip 21 near the bottom surface of the first semiconductor chip 21.

The first semiconductor chip 21 may include a first side surface 21Wb, which is adjacent to and may face the second semiconductor chip 22, and a second side surface 21Wa, which is opposite to the first side surface 21Wb and may face away from the second semiconductor chip 22, and the hot spot HS may be closer to the first side surface 21Wb than to the second side surface 21Wa.

A plurality of first chip pads 21P may be provided in a lower portion of the first semiconductor chip 21, and a plurality of first solder balls 21B may be bonded to bottom surfaces of the first chip pads 21P, respectively. The first solder balls 21B may include two opposite ends, which are connected to the first chip pad 21P and the lower structure 10, respectively, and thus, the first semiconductor chip 21 may be connected to the lower structure 10 through the first solder balls 21B.

The second semiconductor chip 22 may be mounted on the lower structure 10 to be in parallel with the first semiconductor chip 21. The second semiconductor chip 22 may be disposed to be parallel to the first semiconductor chip 21.

The second semiconductor chip 22 may include a logic chip, a buffer chip, or a system-on-chip (SOC). For example, the second semiconductor chip 22 may include an ASIC chip or an AP chip. The ASIC chip may include an application specific integrated circuit (ASIC). The second semiconductor chip 22 may include one of CPU or GPU.

However, in an embodiment, the second semiconductor chip 22 may be a semiconductor chip that is of a different kind than the first semiconductor chip 21.

A plurality of second chip pads 22P may be provided in a lower portion of the second semiconductor chip 22, and a plurality of second solder balls 22B may be bonded to bottom surfaces of the second chip pads 22P, respectively.

The sub-semiconductor package 30 may be disposed on the lower structure 10 to be in parallel with the first and second semiconductor chips 21 and 22. The sub-semiconductor package 30 is illustrated to be adjacent to the first semiconductor chip 21, but in an embodiment, the sub-semiconductor package 30 may be disposed to be adjacent to the second semiconductor chip 22. That is, the sub-semiconductor package 30 may be disposed to be closer to one of the first and second semiconductor chips 21 and 22, which are disposed to be in parallel with each other.

In an embodiment, the sub-semiconductor package 30 may include a substrate 30S, a third semiconductor chip 31, a plurality of bonding wires 32, a third chip pad 30P, a plurality of third solder balls 30B, and a molding element or molding layer 33.

The substrate 30S may be a printed circuit board (PCB) or a redistribution (RDL) substrate.

The third semiconductor chip 31 may be mounted on the substrate 30S. The third semiconductor chip 31 may be provided to have a width that is smaller than the substrate 30S.

Each of the bonding wires 32 may include two ends or end portions, which are respectively bonded to a top surface of the third semiconductor chip 31 and a top surface of the substrate 30S.

Each of the third solder balls 30B may include two opposite ends or end portions, which are respectively bonded to a bottom surface of the substrate 30S and the lower structure 10 to connect the sub-semiconductor package 30 to the lower structure 10.

The third semiconductor chip 31 may be a memory chip, and in an embodiment, it may be a dynamic random access memory (DRAM) chip including a DRAM device. However, the inventive concept is not limited to this example, and the third semiconductor chip may be a volatile memory chip (e.g., a static random access memory (SRAM) chip) or a nonvolatile memory chip (e.g., a FLASH memory chip).

The molding element 33 of the sub-semiconductor package 30 may cover the third semiconductor chip 31 and at least a portion of the top surface of the substrate 30S.

Meanwhile, the molding portion 40 may be provided on the lower structure 10 to cover a top surface of the sub-semiconductor package 30 and to fill a space between the first and second semiconductor chips 21 and 22. The molding portion 40 may be formed of or include at least one of insulating polymer materials (e.g., epoxy molding compound (EMC)).

As shown, the first and second semiconductor chips 21 and 22 may be mounted on the lower structure 10 and may have the same height, and the molding portion 40 may be provided to expose the top surfaces of the first and second semiconductor chips 21 and 22 or to have a top surface that is coplanar with the top surfaces of the first and second semiconductor chips 21 and 22.

In addition, since the sub-semiconductor package 30 may be formed at a height lower than the first and second semiconductor chips 21 and 22, the top surface of the sub-semiconductor package 30 may be covered with the molding portion 40. The molding portion 40 may cover the side and top surfaces of the sub-semiconductor package 30 and the side surfaces of the first and second semiconductor chips 21 and 22.

Meanwhile, the connection chip 5 may be disposed in the lower structure 10. The connection chip 5 may be provided in an upper portion of the lower structure 10. The connection chip 5 may be exposed to the outside of the lower structure 10 near a top surface of the lower structure 10. The connection chip 5 may be disposed below the first and second semiconductor chips 21 and 22. The connection chip 5 may include two portions, which are connected to the first and second semiconductor chips 21 and 22, respectively, and may connect the first semiconductor chip 21 to the second semiconductor chip 22.

In other words, the connection chip 5 may have a structure that is extended from a region adjacent to the first semiconductor chip 21 to a region adjacent to the second semiconductor chip 22. The connection chip 5 may include two portions, one of which is bonded to at least one of the first solder balls 21B, and the other of which is bonded to at least one of the second solder balls 22B.

The connection chip 5 may include a plurality of connection chip pads 5P, which are provided at or near a top surface of the connection chip 5 and are electrically connected to the first and second semiconductor chips 21 and 22. The connection chip pads 5P may be bonded to the solder balls 21B and 22B of the first and second semiconductor chips 21 and 22, respectively.

The connection chip 5 may include a silicon substrate SB and an interlayer insulating layer IL thereon. An interconnection layer 5D may be disposed in the interlayer insulating layer IL. The interconnection layer 5D may be connected to the connection chip pads 5P.

Since the first semiconductor chip 21 and the second semiconductor chip 22 are connected to each other through the connection chip 5, heat, which is generated from the hot spot HS in the first semiconductor chip 21, may be transferred to the second semiconductor chip 22 through the connection chip 5.

For this, the connection chip 5 may be formed of or include a thermally conductive material. For example, the connection chip 5 may be formed of or include silicon (Si). In addition, the connection chip 5 may be thinner than the first semiconductor chip 21.

In particular, the connection chip 5 may be provided to be vertically overlapped with or vertically aligned with the hot spot HS. The connection chip 5 may be placed below the hot spot HS. Referring back to FIG. 1, the connection chip 5 may be overlapped with the entire region of the hot spot HS.

A total area of the connection chip 5 may be about 1/10 to 1/4 of a total area of the first or second semiconductor chip 21 or 22. For example, a total area of the top surface of the connection chip 5 may be about 1/10 to 1/4 of a total area of a bottom surface of the first or second semiconductor chip 21 or 22. In addition, the connection chip 5 may be thinner than the first semiconductor chip 21 and/or the second semiconductor chip 22. In other words, the connection chip 5 may have a first thickness or height t1, and at least one of the first and second semiconductor chips 21 and 22 may have a second thickness or height t2 that is larger than the first thickness t1.

As a result, heat, which is generated from the hot spot HS, may be effectively exhausted or transferred to the second semiconductor chip 22 through the connection chip 5. The connection chip 5 may be configured to quickly dissipate heat, which is generated from the hot spot HS of the first semiconductor chip 21, to the second semiconductor chip 22 adjacent thereto. In addition, since the top surfaces of the first and second semiconductor chips 21 and 22 may not be veiled by the molding portion 40 and are exposed to the outside, the heat, which is generated from the hot spot HS, may be quickly dissipated to the outside. Thus, it may be possible to improve thermal characteristics and operational reliability of the first semiconductor chip 21.

Figure 3:
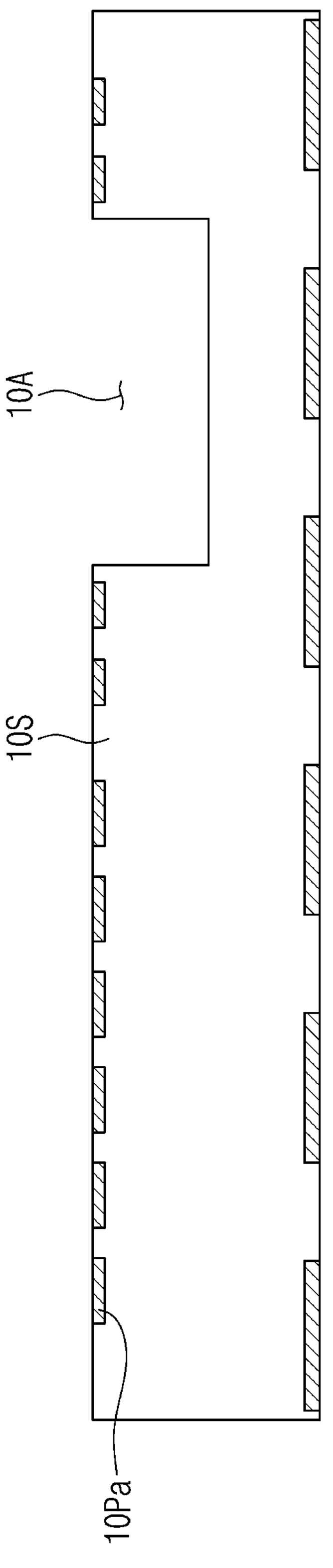
FIGS. 3 to 5 are sectional views illustrating a method of fabricating a semiconductor package, according to an embodiment of the inventive concept.
Figure 4:
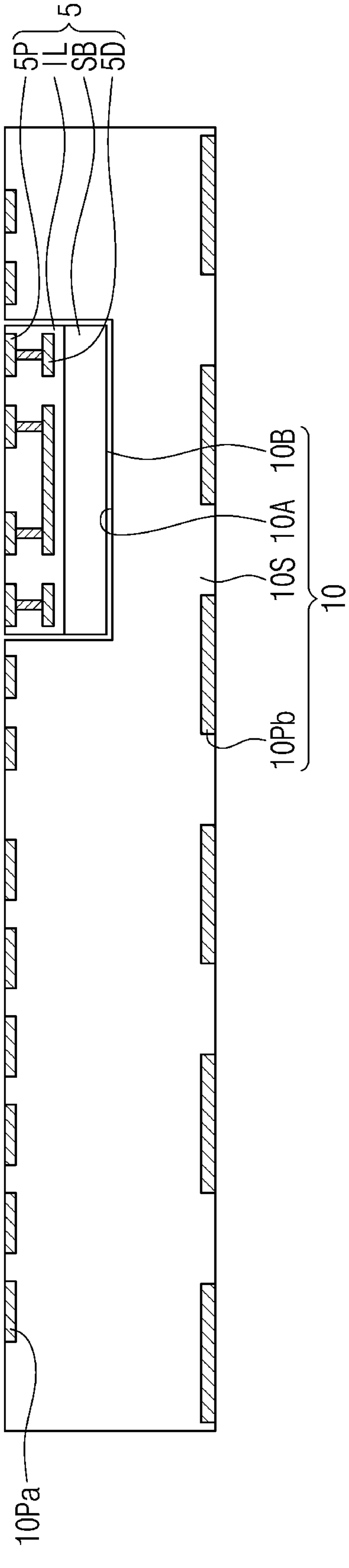
Figure 5:
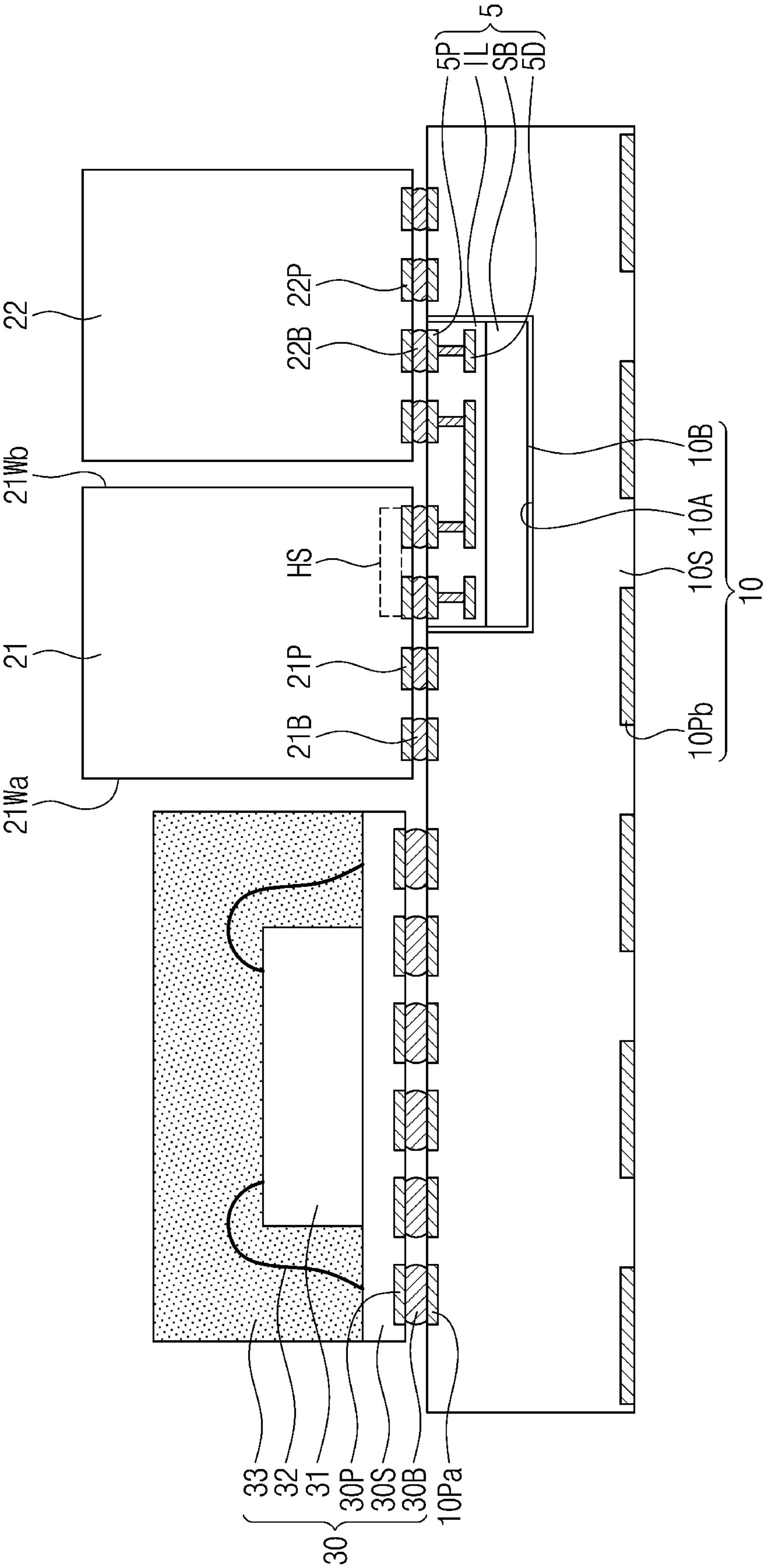

FIGS. 3 to 5 are sectional views illustrating a method of fabricating a semiconductor package, according to an embodiment of the inventive concept.

Referring to FIG. 3, the lower structure 10 may be prepared, and then, the recessed portion 10A may be formed in a portion of the lower structure 10 near the top surface of the lower structure 10. Here, the lower substrate pads 10Pb, which will be connected to outer solder balls 45, may be provided on a bottom surface of the lower structure 10.

The recessed portion 10A, which is provided in an upper portion of the lower structure 10, may be used to place the connection chip 5 therein, and the size and shape of the recessed portion 10A may be determined in consideration of the size and shape of the connection chip 5.

Next, referring to FIG. 4, the connection chip 5 may be inserted in or received in the recessed portion 10A of the lower structure 10. The connection chip 5 may be placed such that a top surface thereof is coplanar with the top surface of the lower structure 10 and may be exposed to the outside of the lower structure 10 near the top surface of the lower structure 10.

An adhesive layer 10B may be provided on an inner surface of the recessed portion 10A to fasten the connection chip 5 to the recessed portion 10A. The adhesive layer 10B may be interposed between the connection chip 5 and the lower structure 10.

Thereafter, as shown in FIG. 5, the sub-semiconductor package 30 and the first and second semiconductor chips 21 and 22 may be mounted on the lower structure 10, in which the connection chip 5 is inserted.

Here, the mounting of the first semiconductor chip 21 may be performed such that the hot spot HS in the first semiconductor chip 21 overlaps the connection chip 5. Next, the second semiconductor chip 22 may be mounted on the lower structure 10 such that it is placed in parallel with the first semiconductor chip 21 and a portion of the second semiconductor chip 22 overlaps the connection chip 5. Here, the upper substrate pads 10Pa, which will be connected to the sub-semiconductor package 30 and the first and second semiconductor chips 21 and 22, may be provided at or in an upper portion of the lower structure 10.

Next, as shown in FIG. 2, the molding portion 40 may be formed on the lower structure 10. The molding portion 40 on the lower structure 10 may be formed to cover the sub-semiconductor package 30 and the first and second semiconductor chips 21 and 22 and to fill spaces between the sub-semiconductor package 30 and the first and second semiconductor chips 21 and 22. The outer solder ball 45 may be bonded to the bottom surface of the lower structure 10.

Figure 6:
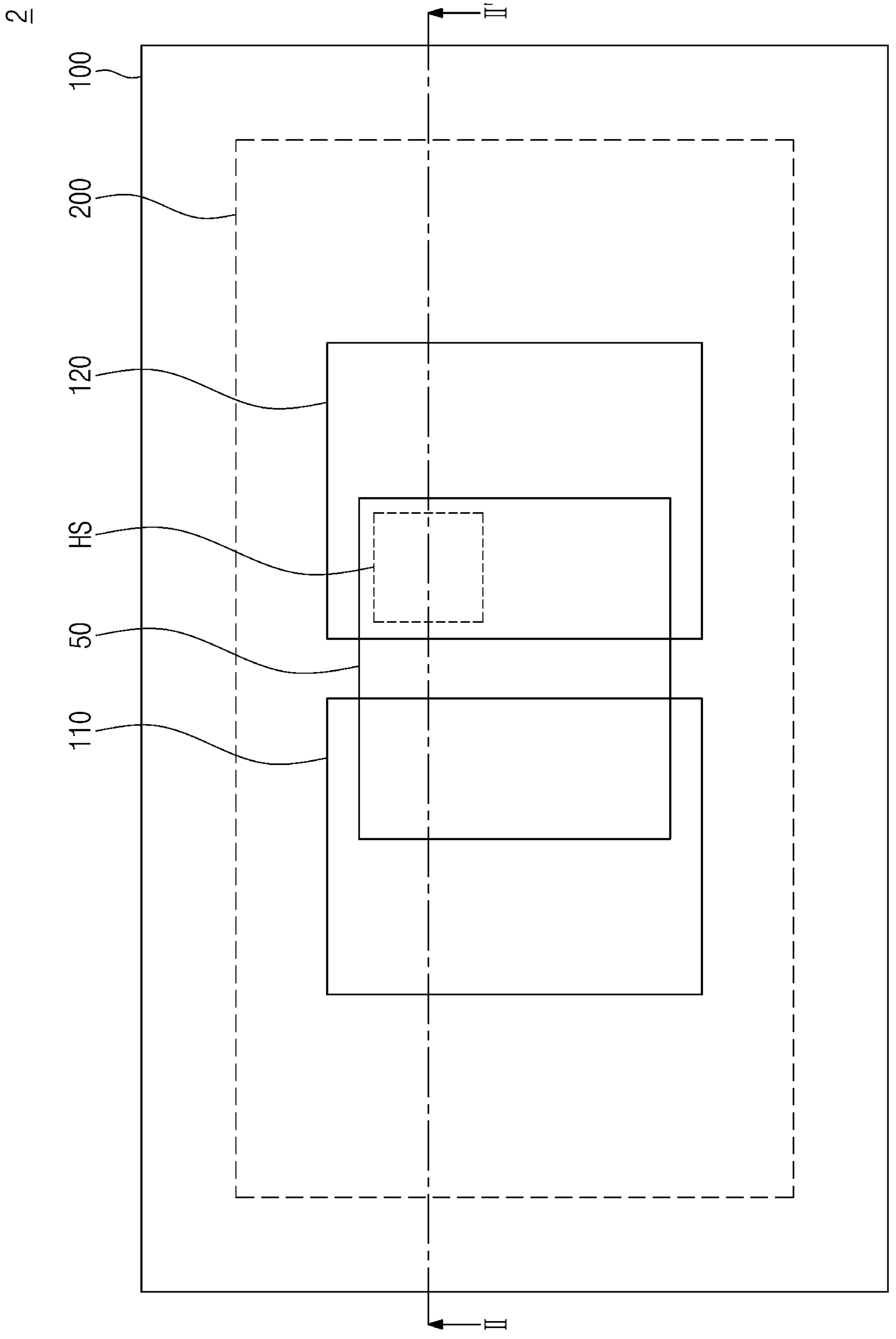
FIG. 6 is a plan view illustrating a semiconductor package according to an embodiment of the inventive concept.
Figure 7:
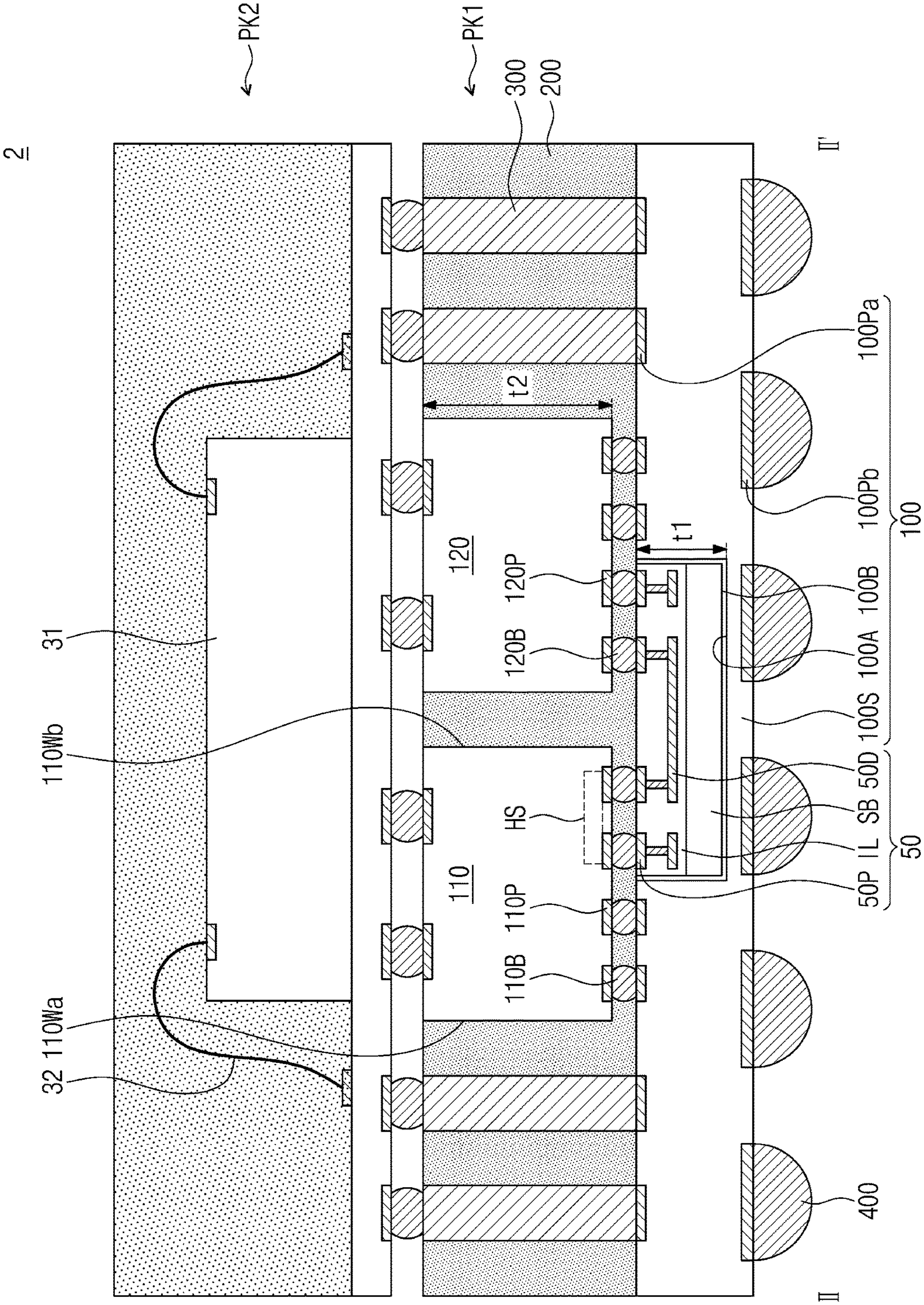
FIG. 7 is a sectional view taken along a line II-II' of FIG. 6.

FIG. 6 is a plan view illustrating a semiconductor package according to an embodiment of the inventive concept, and FIG. 7 is a sectional view taken along a line II-II' of FIG. 6.

Referring to FIGS. 6 and 7, a semiconductor package 2 may include a first sub-semiconductor package PK1 and a second sub-semiconductor package PK2.

As shown in FIG. 6, the semiconductor package 2 may be a package-on-package (POP) structure, in which the second sub-semiconductor package PK2 is stacked on the first sub-semiconductor package PK1.

The first sub-semiconductor package PK1 may include a lower structure 100, a first semiconductor chip 110, a second semiconductor chip 120, a connection chip 50, a molding portion or molding layer 200, and a mold via 300.

The lower structure 100 may include an insulating layer 100S, upper substrate pads 100Pa, and lower substrate pads 100Pb.

The insulating layer 100S may include a recessed portion 100A, which is formed in a top surface thereof. The upper substrate pads 100Pa may be disposed at or on a top surface of the insulating layer 100S, and the lower substrate pads 100Pb may be disposed at or on a bottom surface of the insulating layer 100S.

Each of the first semiconductor chip 110, the second semiconductor chip 120, and the connection chip 50 may have substantially the same structure as a corresponding one of the first semiconductor chip 21, the second semiconductor chip 22, and the connection chip 5 in the semiconductor package 1 described with reference to FIGS. 1 to 5, and thus, for concise description, an element described above may be identified by a similar or identical reference number without repeating an overlapping description thereof.

The first and second semiconductor chips 110 and 120 may be mounted on the lower structure 100. The first and second semiconductor chips 110 and 120 may be disposed on the lower structure 100 to be in parallel with each other.

The first semiconductor chip 110 may include a hot spot HS, which is in the first semiconductor chip 110 and near the second semiconductor chip 120. The first semiconductor chip 110 may include a first side surface 110Wb, which is adjacent to and may face the second semiconductor chip 120, and a second side surface 110Wa, which is opposite to the first side surface 110Wb and may face away from the second semiconductor chip 120, and here, the hot spot HS may be closer to the first side surface 110Wb than to the second side surface 110Wa.

The connection chip 50 may have a structure, which is extended from a region below a bottom edge portion of the first semiconductor chip 110 to a region below a bottom edge portion of the second semiconductor chip 120. The connection chip 50 may be provided below the first and second semiconductor chips 110 and 120 to connect the first and second semiconductor chips 110 and 120 to each other.

The connection chip 50 may include connection chip pads 50P, which are provided at or near a top surface of the connection chip 50 and are connected to the first and second semiconductor chips 110 and 120. In addition, the connection chip 50 may include the silicon substrate SB and the interlayer insulating layer IL thereon. An interconnection layer 50D may be disposed in the interlayer insulating layer IL. The interconnection layer 50D may be connected to the connection chip pads 50P.

Here, referring back to FIG. 6, the connection chip 50 may include a portion, which is provided to be vertically overlapped with the hot spot HS of the first semiconductor chip 110. That is, the portion of the connection chip 50, which is placed below the first semiconductor chip 110, may be vertically overlapped with the hot spot HS.

In addition, the connection chip 50 may be thinner than the first semiconductor chip 110 and/or the second semiconductor chip 120. For example, the connection chip 50 may have a first thickness or height t1, and at least one of the first and second semiconductor chips 110 and 120 may have a second thickness or height t2 that is larger than the first thickness t1.

Accordingly, heat, which is generated from the hot spot HS of the first semiconductor chip 110, may be effectively dissipated to the second semiconductor chip 120 through the connection chip 50, and this may make it possible to improve the thermal characteristics and operational reliability of the first semiconductor chip 110. Meanwhile, the first and second semiconductor chips 110 and 120 may be disposed on a center portion of the lower structure 100, and a plurality of mold vias 300 may be disposed on an edge portion of the lower structure 100.

The molding portion 200 may be provided on the lower structure 100 to at least partially cover the lower structure 100, the first semiconductor chip 110, the second semiconductor chip 120, and the mold via 300. The molding portion 200 may cover the top surface of the lower structure 100 and may fill spaces between the first and second semiconductor chips 110 and 120, between the mold vias 300, and between the mold via 300 and the first and second semiconductor chips 110 and 120.

Here, the mold vias 300 may be provided to have a via structure penetrating the molding portion 200.

The molding portion 200 may be provided to have a top surface that is coplanar with the top surfaces of the mold vias 300, the top surface of the first semiconductor chip 110, and the top surface of the second semiconductor chip 120.

The second sub-semiconductor package PK2 may be mounted on the first sub-semiconductor package PK1. For example, the second sub-semiconductor package PK2 may be mounted on the molding portion 200.

In an embodiment, the second sub-semiconductor package PK2 may have the same or similar structure as the sub-semiconductor package 30 of the semiconductor package 1 described with reference to FIGS. 1 to 5, and thus, a detailed description thereof will be omitted.

FIGS. 8 to 11 are sectional views illustrating a method of fabricating a semiconductor package, according to an embodiment of the inventive concept.

Figure 8:
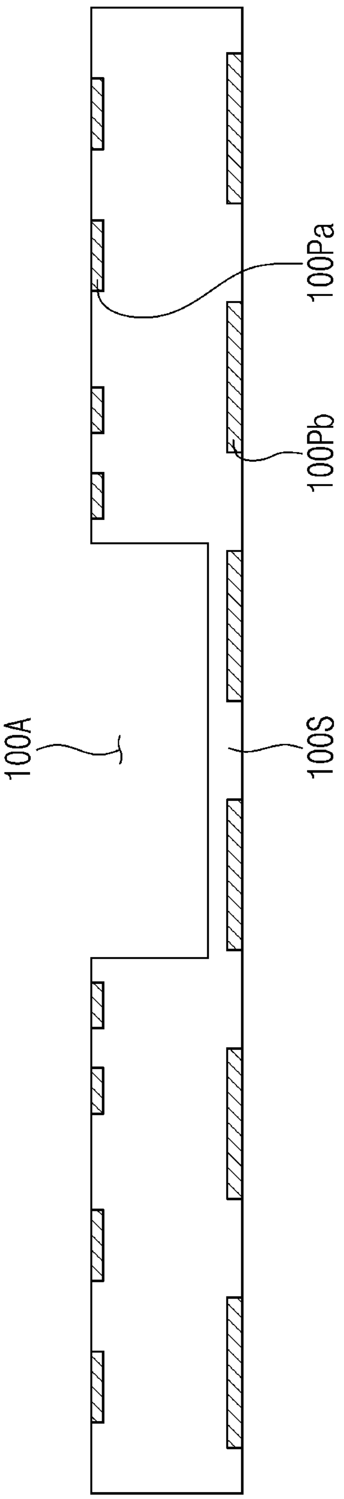
FIGS. 8 to 11 are sectional views illustrating a method of fabricating a semiconductor package, according to an embodiment of the inventive concept.

Referring to FIG. 8, the lower structure 100 may be prepared, and then, the recessed portion 100A may be formed in the top surface of the lower structure 100. Here, the lower substrate pad 100Pb may be provided at or on the bottom surface of the lower structure 100.

The recessed portion 100A, which is formed in an upper portion of the lower structure 100, may be used to place the connection chip 50 therein, and the size and shape of the recessed portion 100A may be determined in consideration of the size and shape of the connection chip 50. An adhesive layer 100B may be formed on an inner surface of the recessed portion 100A to fasten the connection chip 50 to the recessed portion 100A. The adhesive layer 100B may be interposed between the connection chip 50 and the lower structure 100.

Figure 9:
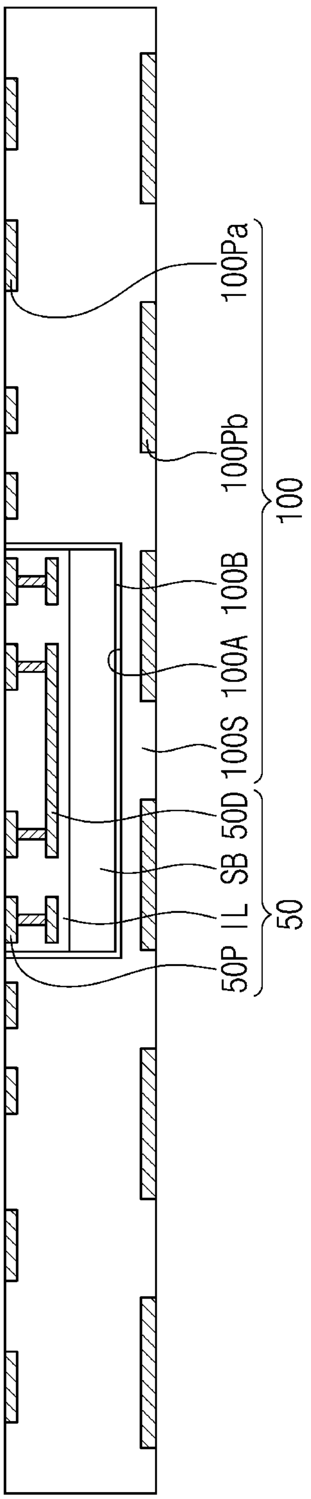

Next, referring to FIG. 9, the connection chip 50 may be inserted into the recessed portion 100A of the lower structure 100. The connection chip 50 may be provided to have a top surface that is coplanar with the top surface of the lower structure 100 and is exposed to the outside of the lower structure 100 near the top surface of the lower structure 100.

Figure 10:
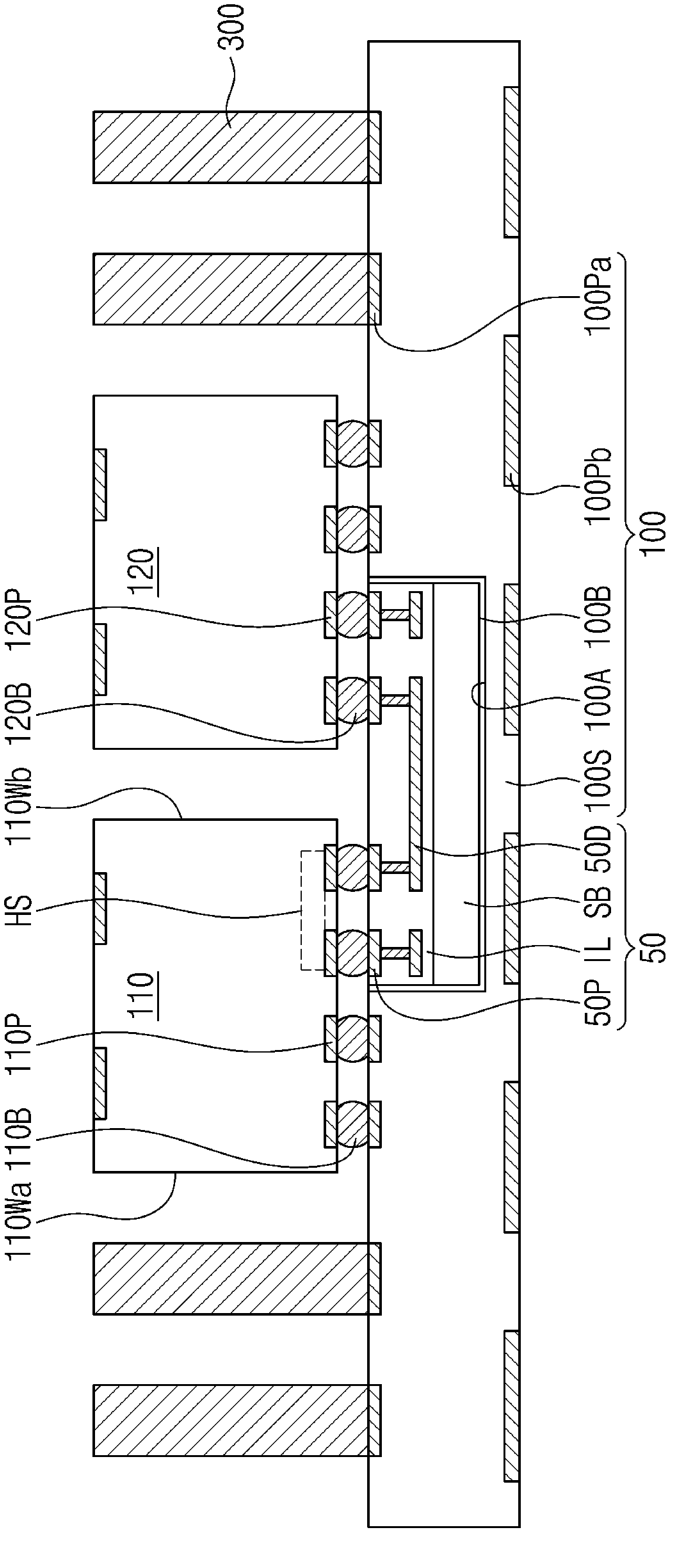

Thereafter, referring to FIG. 10, the first semiconductor chip 110, the second semiconductor chip 120, and the mold vias 300 may be mounted on the lower structure 100, in which the connection chip 50 is inserted.

First chip pads 110P may be provided at or on a bottom surface of the first semiconductor chip 110, and a plurality of first solder balls 110B may be attached to bottom surfaces of the first chip pads 110P, respectively. Second chip pads 120P may be provided at or on a bottom surface of the second semiconductor chip 120, and a plurality of second solder balls 120B may be attached to bottom surfaces of the second chip pads 120P, respectively.

Here, the first semiconductor chip 110 may be mounted such that the hot spot HS in the first semiconductor chip 110 overlaps the connection chip 50. Next, the second semiconductor chip 120 may be mounted on the lower structure 100 such that the second semiconductor chip 120 is placed in parallel with the first semiconductor chip 110 and a portion of the second semiconductor chip 120 overlaps the connection chip 50.

Here, the upper substrate pads 100Pa, which are connected to the first and second semiconductor chips 110 and 120, may be provided in an upper portion of the lower structure 100.

Figure 11:
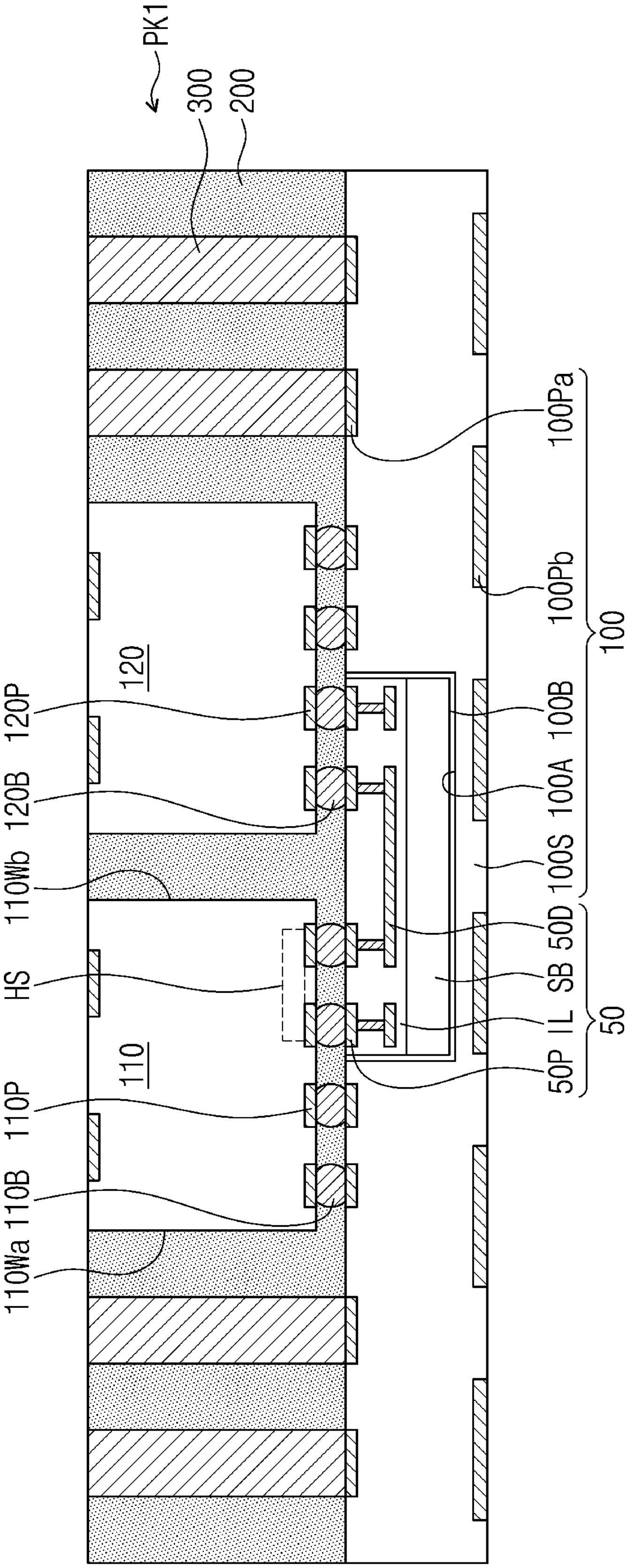

Next, referring to FIG. 11, the molding portion 200 may be formed on the lower structure 100. The molding portion 200 may be formed to at least partially cover the first semiconductor chip 110, the second semiconductor chip 120, and the mold vias 300 on the lower structure 100, and as a result, a process of fabricating the first sub-semiconductor package PK1 may be finished.

Next, referring back to FIG. 7, the second sub-semiconductor package PK2 may be mounted on the first sub-semiconductor package PK1. Thereafter, outer solder balls 400 may be bonded to the lower substrate pads 100Pb. As a result, a process of fabricating the semiconductor package 2 may be finished.

Figure 12:
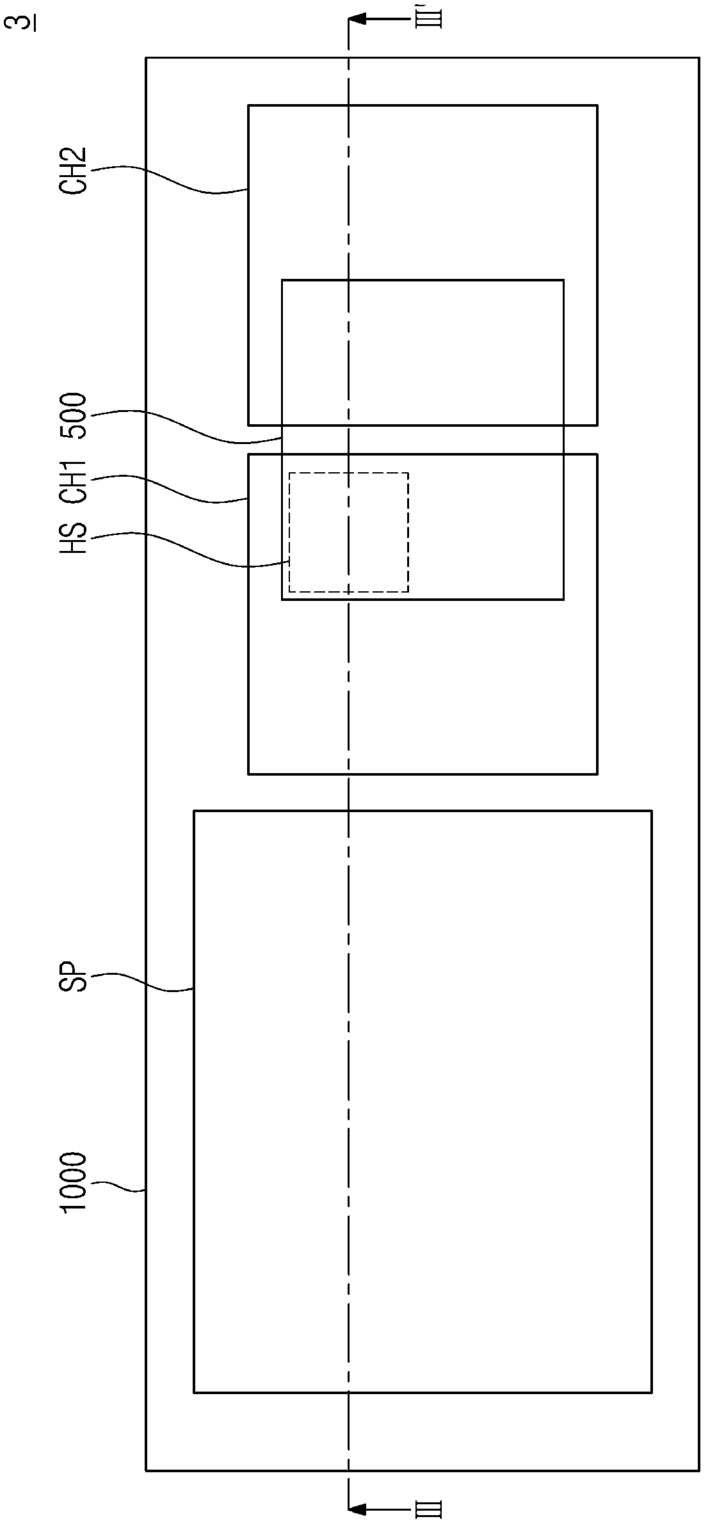
FIG. 12 is a plan view illustrating a semiconductor package according to an embodiment of the inventive concept.
Figure 13:
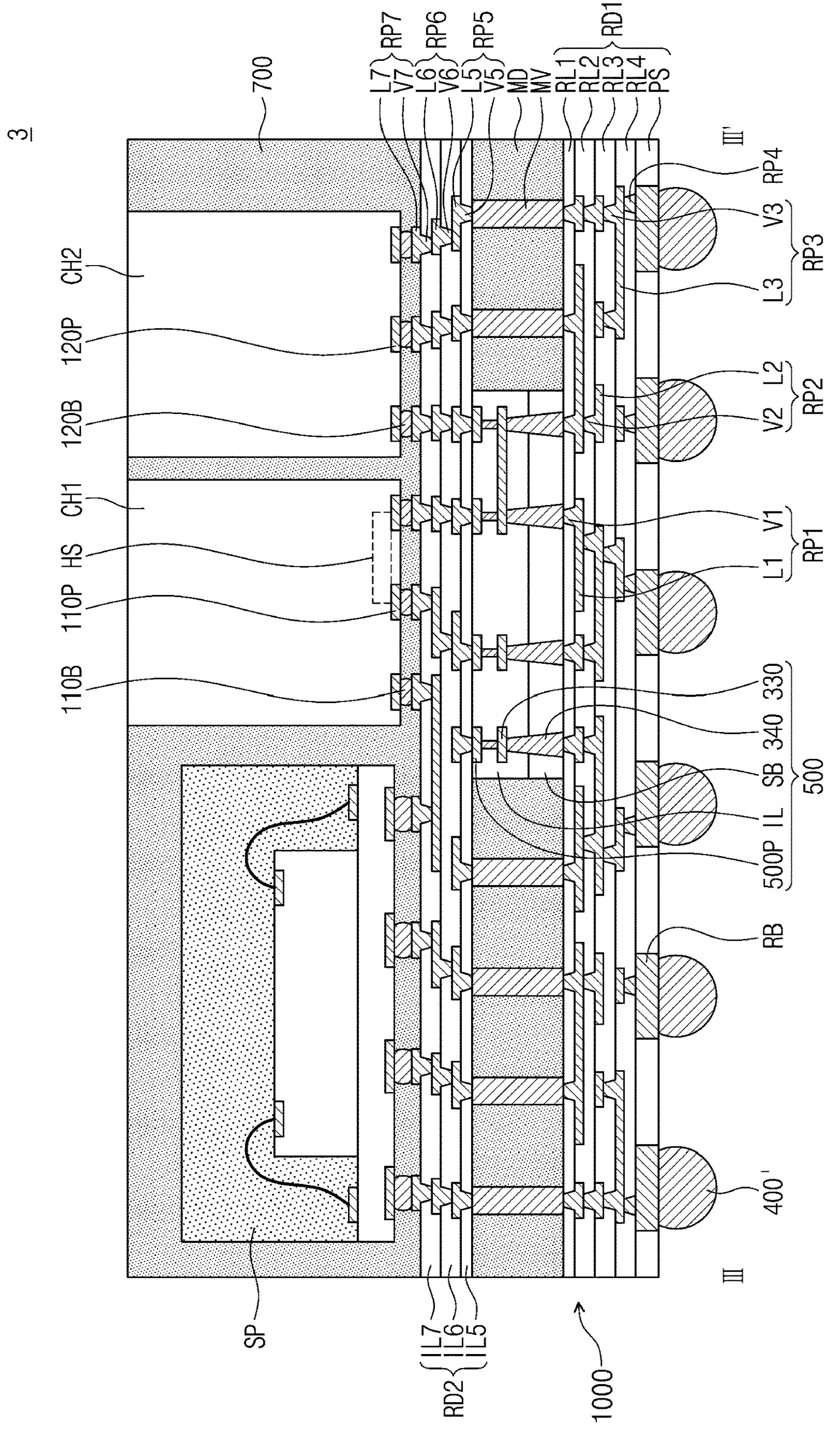
FIG. 13 is a sectional view taken along a line III-III' of FIG. 12.

FIG. 12 is a plan view illustrating a semiconductor package according to an embodiment of the inventive concept, and FIG. 13 is a sectional view taken along a line III-III' of FIG. 12.

Except for some differences associated with the lower structure, the semiconductor package in the present embodiment may be substantially the same as the semiconductor package described with reference to FIGS. 1 to 5, and thus, for concise description, an element described above may be identified by a similar or identical reference number without repeating an overlapping description thereof.

Referring to FIGS. 12 and 13, a lower structure 1000 of a semiconductor package 3 may include a first redistribution substrate RD1, a second redistribution substrate RD2, a connection chip 500, a mold via MV, and a mold layer MD.

The first redistribution substrate RD1 may include redistribution insulating layers RL (RL1-RL4) and redistribution pattern RP (RP1-RP4). The redistribution insulating layer RL may be a single layer or may include a plurality of layers stacked. In an embodiment, an interface between two adjacent ones of the redistribution insulating layers RL may not be observable or visible.

The number of the stacked redistribution insulating layers RL is not limited to that in the illustrated example and may be variously changed. The redistribution insulating layer RL may be formed of or include at least one of insulating polymer materials or photoimageable dielectric (PID) materials. For example, the photoimageable dielectric materials may include photoimageable polyimide, polybenzoxazole (PBO), phenol-based polymers, or benzocyclobutene-based polymers.

A redistribution pattern RP may be disposed in the redistribution insulating layer RL. In an embodiment, a plurality of redistribution patterns RP may be provided. Each of the redistribution patterns RP may include a line portion L and a via portion V.

More specifically, the first redistribution substrate RD1 may be in contact with the connection chip 500. The first redistribution substrate RD1 may include first to fourth redistribution insulating layers RL1 to RL4, which are sequentially stacked in a downward or vertical direction. First to fourth redistribution patterns RP1, RP2, RP3, and RP4 may be disposed between or in the first to fourth redistribution insulating layers RL1, RL2, RL3, and RL4.

The first redistribution pattern RP1 may include a first via portion V1, which is provided to penetrate the first redistribution insulating layer RL1, and a first line portion L1, which is provided between the first redistribution insulating layer RL1 and the second redistribution insulating layer RL2. The first via portion V1 and the first line portion L1 may be formed as a single object. The second redistribution pattern RP2 may include a second via portion V2, which is provided to penetrate the second redistribution insulating layer RL2, and a second line portion L2, which is provided between the second redistribution insulating layer RL2 and the third redistribution insulating layer RL3. The second via portion V2 and the second line portion L2 may be formed as a single object. The third redistribution pattern RP3 may include a third via portion V3, which is provided to penetrate the third redistribution insulating layer RL3, and a third line portion L3, which is provided between the third redistribution insulating layer RL3 and the fourth redistribution insulating layer RL4. The third via portion V3 and third line portion L3 may be formed as a single object. The fourth redistribution pattern RP4 may be provided to penetrate the fourth redistribution insulating layer RL4 and to have a shape of a via plug. A bottom surface of the fourth redistribution insulating layer RL4 may be covered with a protection layer PS. A redistribution bump RB may be placed in the protection layer PS. The protection layer PS may include at least one of photoimageable dielectric (PID) materials.

Each of the first to fourth via portions V1 to V4 may have an increasing width in a downward direction. At least one of the first via portions V1 may be in contact with the connection chip 500. The mold via MV may be in contact with at least one of the first via portions V1, which is not in contact with the connection chip 500.

The connection chip 500 and the mold vias MV may be mounted on the first redistribution substrate RD1. The connection chip 500 may include a connection chip pad 500P, which is at a top surface portion of the connection chip 500 and is in contact with the second redistribution substrate RD2 to be described below.

The mold vias MV may be disposed on the first redistribution substrate RD1 to be in parallel with the connection chip 500. The mold vias MV may be disposed beside or around the connection chip 500.

Each of the mold vias MV may be formed of or include at least one metallic material that is selected from the group consisting of silver (Ag), copper (Cu), gold (Au), chromium (Cr), aluminum (Al), tungsten (W), zinc (Zn), nickel (Ni), iron (Fe), platinum (Pt), and lead (Pb).

The mold layer MD may cover at least a portion of a top surface of the first redistribution substrate RD1 and may fill a space between the mold via MV and the connection chip 500 and may fill spaces between the mold vias MV. The mold layer MD may be formed of or include at least one of insulating polymer materials (e.g., epoxy molding compound (EMC)).

The connection chip 500 may include the silicon substrate SB and the interlayer insulating layer IL thereon. An interconnection layer 330 may be disposed in the interlayer insulating layer IL. The interconnection layer 330 may be connected to a plurality of connection chip pads 500P. In addition, the connection chip 500 may include a plurality of penetration vias 340, which are provided to penetrate the silicon substrate SB and a portion of the interlayer insulating layer IL and are connected to the interconnection layer 330.

The second redistribution substrate RD2 may be mounted on the mold layer MD. The second redistribution substrate RD2 may include fifth to seventh redistribution insulating layers IL5, IL6, and IL7 sequentially stacked. Each of the fifth to seventh redistribution insulating layers IL5, IL6, and IL7 may include a photoimageable dielectric (PID) layer.

A fifth redistribution pattern RP5 may be disposed between the fifth and sixth redistribution insulating layers IL5 and IL6. The fifth redistribution pattern RP5 may include a fifth via portion V5, which is provided to penetrate the fifth redistribution insulating layer IL5, and a fifth line portion L5, which is provided between the fifth and sixth redistribution insulating layers IL5 and IL6. The fifth via portion V5 and the fifth line portion L5 may be formed as a single object. The fifth via portion V5 may be electrically connected to the mold via MV.

A sixth redistribution pattern RP6 may be disposed between the sixth redistribution insulating layer IL6 and the seventh redistribution insulating layer IL7. The sixth redistribution pattern RP6 may include a sixth via portion V6, which is provided to penetrate the sixth redistribution insulating layer IL6, and a sixth line portion L6, which is provided between the sixth and seventh redistribution insulating layers IL6 and IL7. The sixth via portion V6 and the sixth line portion L6 may be formed as a single object.

A seventh redistribution pattern RP7 may be disposed on the seventh redistribution insulating layer IL7. The seventh redistribution pattern RT7 may include a seventh via portion V7, which is provided to penetrate the seventh redistribution insulating layer IL7, and a seventh line portion L7, which is provided on the seventh redistribution insulating layer IL7.

A first semiconductor chip CH1, a second semiconductor chip CH2, and a sub-semiconductor package SP may be mounted on the second redistribution substrate RD2. In this case, the first and second semiconductor chips CH1 and CH2 may be mounted on the first redistribution substrate RD1 to be vertically overlapped with the connection chip 500, and thus, they may be connected to each other through the connection chip 500. Accordingly, heat, which is generated from the hot spot HS of the first semiconductor chip CH1, may be transferred to the second semiconductor chip CH2 through the connection chip 500.

The lower structure 1000 may be applied to a semiconductor package having a system-in-package (SIP) structure, as shown in FIG. 13, but in an embodiment, the lower structure 1000 may also be applied to a package-on-package (POP) semiconductor package, in which the second sub-semiconductor package is stacked on the first sub-semiconductor package.

FIGS. 14 to 20 are sectional views illustrating a method of fabricating a semiconductor package, according to an embodiment of the inventive concept.

Figure 14:
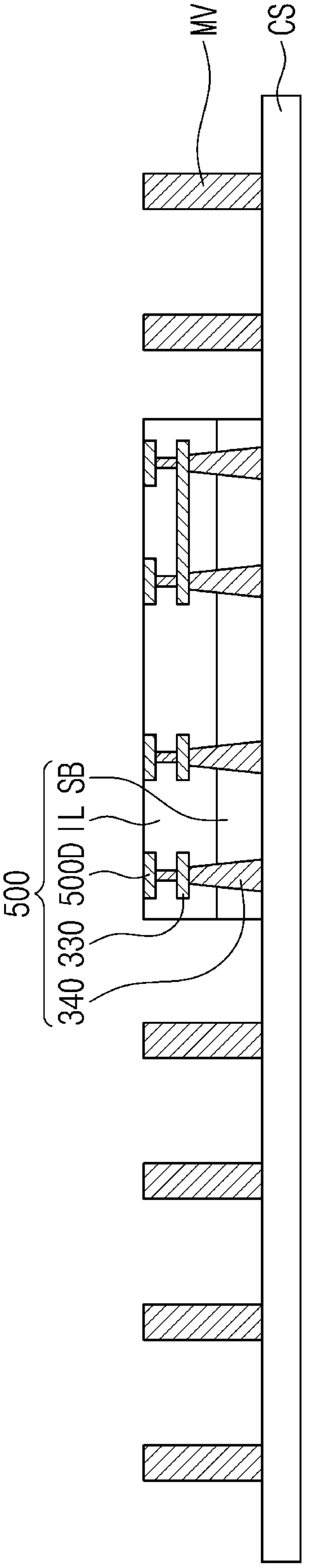
FIGS. 14 to 20 are sectional views illustrating a method of fabricating a semiconductor package, according to an embodiment of the inventive concept.

Referring to FIG. 14, the mold vias MV and the connection chip 500 may be attached to a carrier substrate CS. The carrier substrate CS may include, for example, polymer. As an example, the carrier substrate CS may include an adhesive tape.

Figure 15:
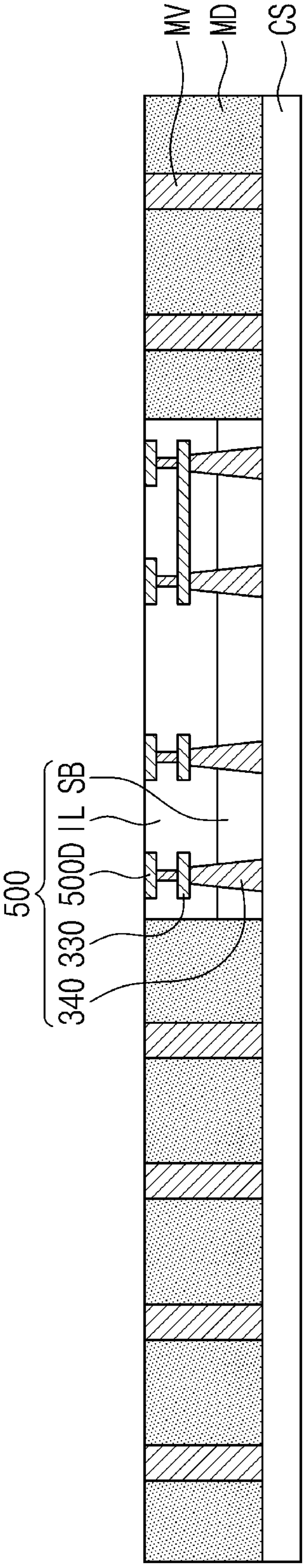

Referring to FIG. 15, the mold layer MD may be formed on the carrier substrate CS. The mold layer MD may cover a top surface of the carrier substrate CS, side surfaces of the mold vias MV, and a side surface of the connection chip 500.

Figure 16:
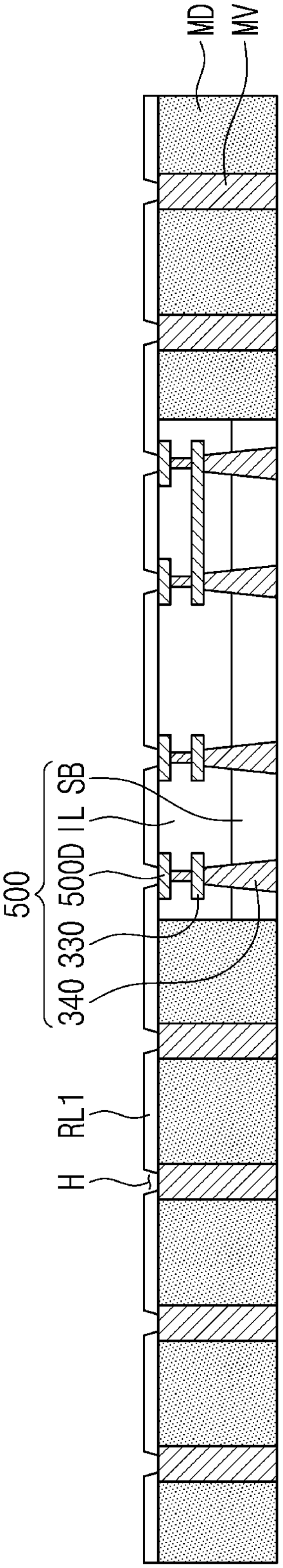

Referring to FIG. 16, the carrier substrate CS may be inverted such that a bottom surface of the connection chip 500 is placed at an upper level. Thereafter, the carrier substrate CS may be removed.

The redistribution insulating layer RL1 may be patterned to form a plurality of holes H in the redistribution insulating layer RL1. The patterning of the redistribution insulating layer RL1 may include forming a photoresist layer on the redistribution insulating layer RL1, performing exposure and developing steps on the photoresist layer to form a photoresist pattern, and etching the redistribution insulating layer RL1 using the photoresist pattern as an etch mask. The patterning of the redistribution insulating layer RL1 may include performing an exposure process and a developing process.

Figure 17:
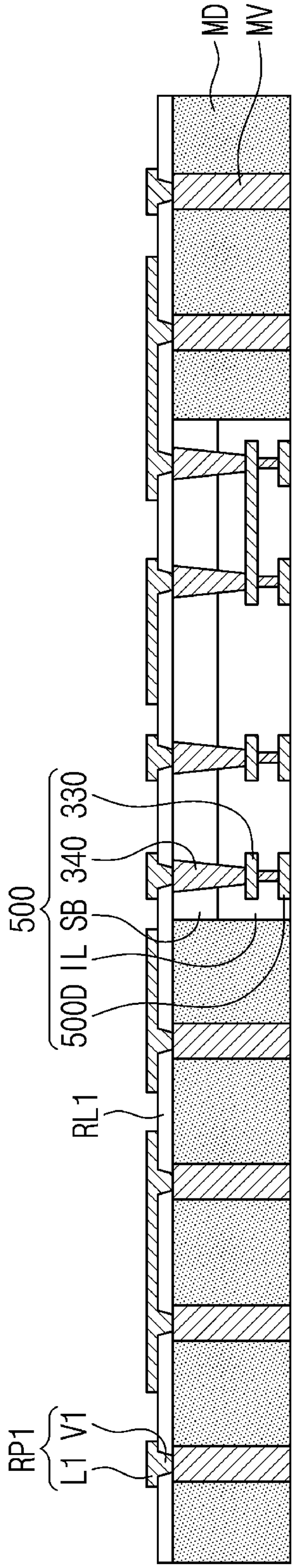

Referring to FIG. 17, the redistribution patterns RP1 may be formed on the redistribution insulating layer RL1. As an example, the formation of the redistribution pattern RP1 may include forming a seed layer on the redistribution insulating layer RL1, performing an electroplating process using the seed layer as an electrode to form a conductive layer, and patterning the conductive layer and the seed layer. The conductive layer may be formed of or include at least one of metallic materials (e.g., copper (Cu)).

The redistribution pattern RP1 may include a via portion V1, which is formed in the hole H, and a line portion L1, which is provided on the redistribution insulating layer RL1.

Figure 18:
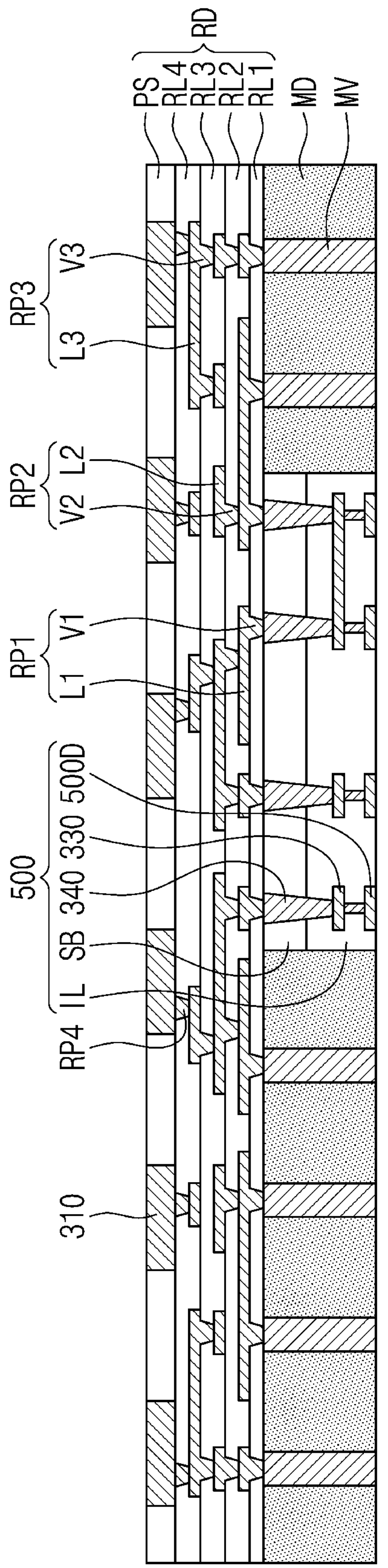

Referring to FIG. 18, the steps of forming the redistribution insulating layer RL and forming the redistribution patterns RP may be repeated several times. Accordingly, the first redistribution substrate RD1 including a plurality of redistribution insulating layers RL1 to RL4 and a plurality of redistribution patterns RP1 to RP4 may be provided.

Figure 19:
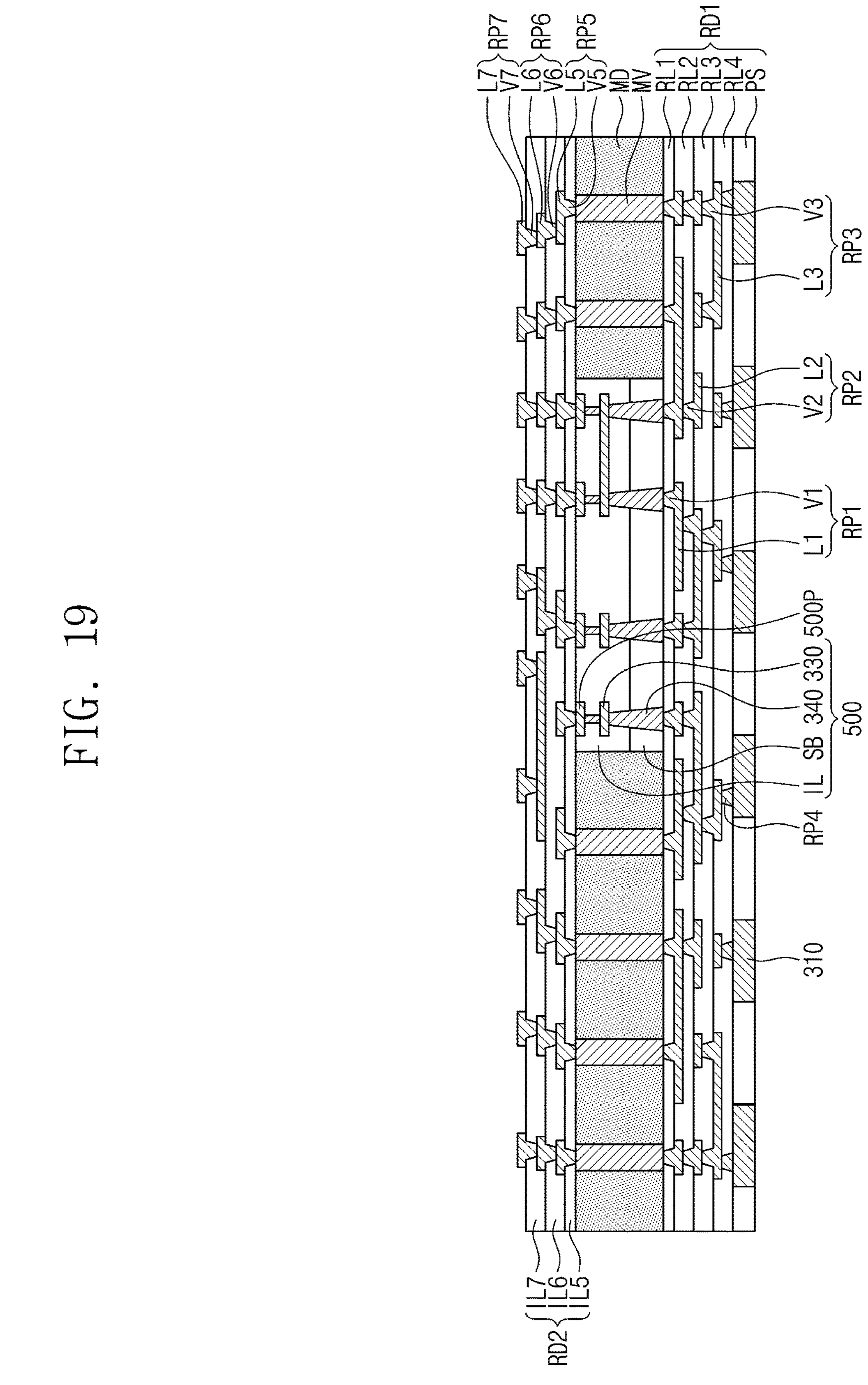

Next, referring to FIG. 19, the second redistribution substrate RD2 may be formed on the mold layer MD. The second redistribution substrate RD2 may be formed by substantially the same process as the afore-described process of forming the first redistribution substrate RD1.

Figure 20:
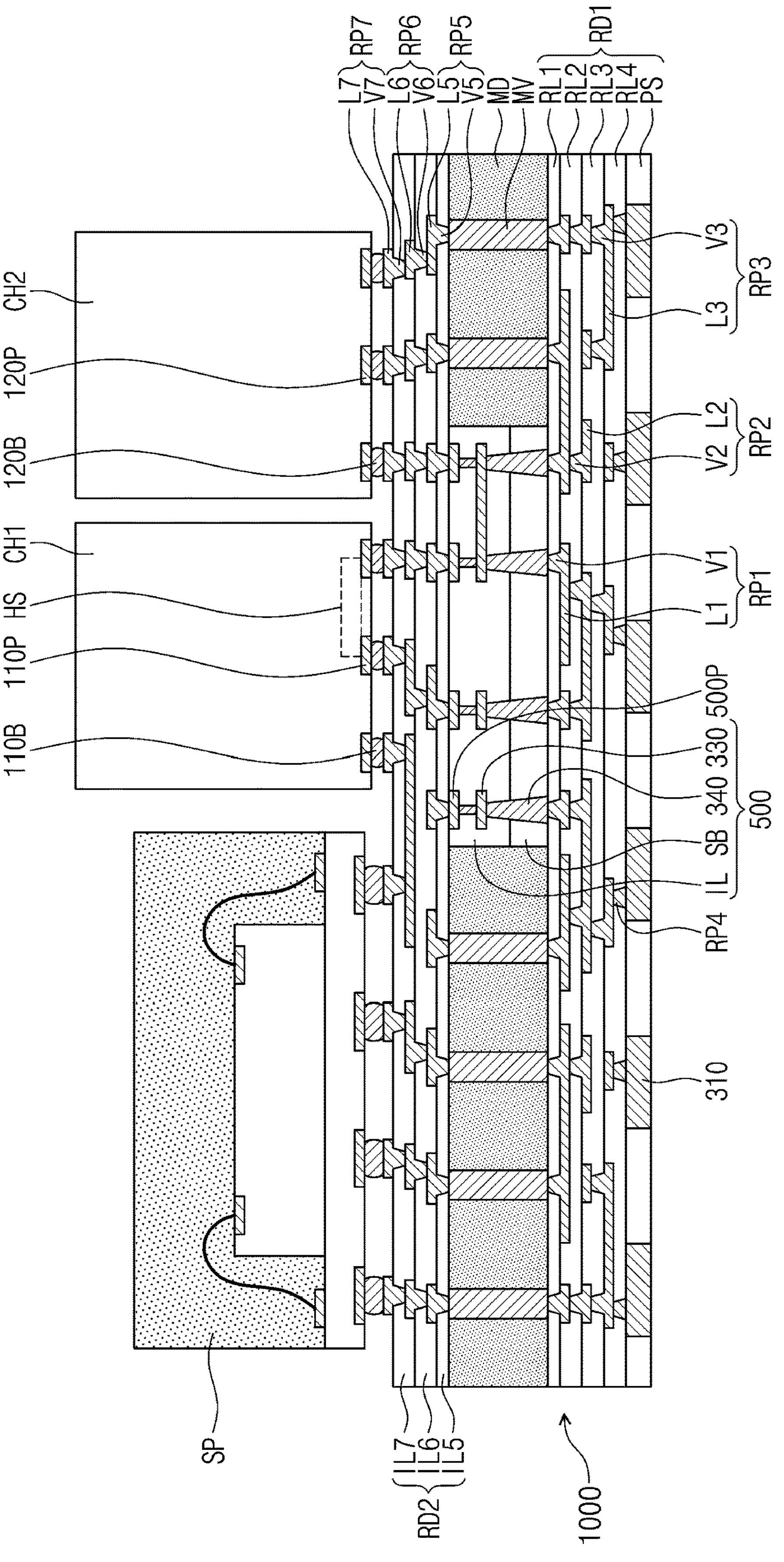

Next, referring to FIG. 20, the sub-semiconductor package SP and the first and second semiconductor chips CH1 and CH2 may be mounted on the second redistribution substrate RD2.

Here, the first semiconductor chip CH1 may be mounted such that the hot spot HS in the first semiconductor chip CH1 overlaps the connection chip 500. Next, the second semiconductor chip CH2 may be mounted on the lower structure 1000 such that it is placed in parallel with the first semiconductor chip CH1 and a portion of the second semiconductor chip CH2 overlaps the connection chip 500.

Thereafter, referring back to FIG. 13, a molding portion 700 may be formed on the lower structure 1000. The molding portion 700 on the lower structure 1000 may cover a top surface of the sub-semiconductor package SP and may fill a space between the first and second semiconductor chips CH1 and CH2. In addition, an outer solder ball 400' may be bonded to a bottom surface of the first redistribution substrate RD1. As a result of the above process, the semiconductor package may be fabricated to have substantially the same structure as the semiconductor package 3 described with reference to FIG. 13.

According to an embodiment of the inventive concept, when viewed in a plan view, a hot spot of a first semiconductor chip overlaps a connection chip connecting the first semiconductor chip to a second semiconductor chip, and thus, heat, which is generated from the hot spot of the first semiconductor chip during an operation of a semiconductor package, may be transferred to the second semiconductor chip through the connection chip. Accordingly, it may be possible to quickly lower a temperature of the first semiconductor chip and thereby to improve thermal characteristics and operational reliability of the semiconductor package.

While example embodiments of the inventive concept have been particularly shown and described, it will be understood by one of ordinary skill in the art that variations in form and detail may be made therein without departing from the scope of the attached claims.

What is claimed is:

1. A semiconductor package, comprising:

a lower structure;

a first semiconductor chip on the lower structure, the first semiconductor chip comprising a hot spot;

a second semiconductor chip horizontally spaced apart from the first semiconductor chip on the lower structure; and a connection chip in the lower structure and connecting the first and second semiconductor chips to each other, wherein the hot spot vertically overlaps the connection chip, and wherein the connection chip comprises:

a silicon substrate;

an interlayer insulating layer on the silicon substrate; and an interconnection layer in the interlayer insulating layer.

2. The semiconductor package of claim 1, wherein the first semiconductor chip comprises a first side surface adjacent the second semiconductor chip, and a second side surface which is opposite to the first side surface, and the hot spot is closer to the first side surface than to the second side surface.

3. The semiconductor package of claim 1, wherein the connection chip is exposed to an outside of the lower structure at a top surface of the lower structure.

4. The semiconductor package of claim 1, wherein the lower structure comprises:

an insulating layer including a recessed portion in a top surface thereof;

upper substrate pads at the top surface of the insulating layer; and lower substrate pads at a bottom surface of the insulating layer.

5. The semiconductor package of claim 1, wherein the lower structure comprises:

a first redistribution substrate with the connection chip thereon;

a mold via on the first redistribution substrate and adjacent the connection chip;

a mold layer at least partially covering a top surface of the first redistribution substrate and in a space between the mold via and the connection chip; and a second redistribution substrate on the mold layer.

6. The semiconductor package of claim 1, further comprising a sub-semiconductor package horizontally spaced apart from the first and second semiconductor chips on the lower structure.

7. The semiconductor package of claim 6, further comprising a molding portion at least partially covering the first and second semiconductor chips and the sub-semiconductor package.

8. The semiconductor package of claim 1, further comprising a molding portion on the lower structure and the first and second semiconductor chips.

9. The semiconductor package of claim 8, further comprising a sub-semiconductor package on the molding portion.

10. The semiconductor package of claim 9, further comprising a mold via that penetrates the molding portion and connects the sub-semiconductor package to the lower structure.

11. The semiconductor package of claim 9, wherein the sub-semiconductor package comprises:

a substrate;

a third semiconductor chip on the substrate; and a plurality of bonding wires connecting the substrate and the third semiconductor chip.

12. The semiconductor package of claim 11, wherein the third semiconductor chip comprises a DRAM device.

13. The semiconductor package of claim 1, wherein the hot spot is an intellectual property (IP) block including at least one of a central processing unit (CPU), a graphics processing unit (GPU), or a neural network processing unit (NPU).

14. A semiconductor package, comprising:

a lower structure;

a first semiconductor chip on the lower structure, the first semiconductor chip comprising a hot spot;

a second semiconductor chip horizontally spaced apart from the first semiconductor chip on the lower structure;

a connection chip in the lower structure and connecting the first semiconductor chip to the second semiconductor chip;

an adhesive layer between the connection chip and the lower structure; and a molding portion on the lower structure and the first and second semiconductor chips, wherein the hot spot is an intellectual property (IP) block including at least one of a central processing unit (CPU), a graphics processing unit (GPU), or a neural network processing unit (NPU), the connection chip is vertically aligned with the hot spot, a top surface of the connection chip is exposed to an outside of the lower structure at a top surface of the lower structure, a top surface of at least one of the first and second semiconductor chips is exposed to an outside of the molding portion at a top surface of the molding portion, the connection chip has a first thickness, and at least one of the first and second semiconductor chips has a second thickness larger than the first thickness, wherein the connection chip comprises:

a silicon substrate;

an interlayer insulating layer on the silicon substrate; and an interconnection layer in the interlayer insulating layer.

15. The semiconductor package of claim 14, wherein the first semiconductor chip comprises a first side surface adjacent the second semiconductor chip and an opposite second side surface facing away from the second semiconductor chip, and the hot spot is closer to the first side surface than to the second side surface.

16. The semiconductor package of claim 14, wherein a total area of a top surface of the connection chip is about 1/10 to 1/4 of a total area of a bottom surface of the first semiconductor chip.

17. A semiconductor package, comprising:

a lower structure comprising a recessed portion;

a first semiconductor chip and a second semiconductor chip on the lower structure;

a connection chip in the recessed portion of the lower structure and connecting the first and second semiconductor chips;

a sub-package horizontally spaced apart from the first and second semiconductor chips on the lower structure; and a molding portion on the lower structure, the first and second semiconductor chips, and the sub-package, wherein the first semiconductor chip comprises a hot spot therein, wherein the hot spot and at least a portion of the second semiconductor chip overlap the connection chip in a vertical direction, and wherein a total area of a top surface of the connection chip is about 1/10 to 1/4 of a total area of a bottom surface of the first semiconductor chip.

18. The semiconductor package of claim 17, wherein the hot spot is an intellectual property (IP) block including at least one of a central processing unit (CPU), a graphics processing unit (GPU), or a neural network processing unit (NPU).

19. The semiconductor package of claim 17, wherein the first semiconductor chip comprises a first side surface, which is adjacent and faces the second semiconductor chip, and a second side surface, which is opposite to the first side surface and faces away from the second semiconductor chip, and the hot spot is closer to the first side surface than to the second side surface.

20. The semiconductor package of claim 18, wherein the connection chip comprises:

a silicon substrate;

an interlayer insulating layer on the silicon substrate; and an interconnection layer in the interlayer insulating layer.

* * * * *